US008740355B2

(12) United States Patent
Nawano et al.

(10) Patent No.: US 8,740,355 B2
(45) Date of Patent: Jun. 3, 2014

(54) LIQUID EJECTING HEAD, LIQUID EJECTING APPARATUS, PIEZOELECTRIC ELEMENT, AND PIEZOELECTRIC CERAMIC

(75) Inventors: Masahisa Nawano, Nagano (JP); Tomokazu Kobayashi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 54 days.

(21) Appl. No.: 13/316,212

(22) Filed: Dec. 9, 2011

(65) Prior Publication Data
US 2012/0147100 A1    Jun. 14, 2012

(30) Foreign Application Priority Data

Dec. 10, 2010 (JP) .................. 2010-275640
Oct. 18, 2011 (JP) .................. 2011-229048

(51) Int. Cl.
   *B41J 2/045*    (2006.01)
(52) U.S. Cl.
   USPC .......................................................... 347/68
(58) Field of Classification Search
   None
   See application file for complete search history.

(56) References Cited

U.S. PATENT DOCUMENTS

| 7,896,479 B2 * | 3/2011 | Kazama et al. ............ 347/68 |
| 2008/0203856 A1 | 8/2008 | Miyazawa |
| 2009/0230211 A1 | 9/2009 | Kobayashi et al. |
| 2009/0243438 A1 * | 10/2009 | Hamada et al. ............ 310/358 |

FOREIGN PATENT DOCUMENTS

JP    2008-211140    9/2008

OTHER PUBLICATIONS

Wu Jiagang et al: "Multiferroic Behavior of BeFiO3-RTiO3 (Mg, Sr, Ca, Ba, and Pb) Thin Films", Journal of Applied Physics, American Institutes of Physics, New York, US, vol. 108, No. 2, Jul. 21, 2010, pp. 26101-26101, XPO12142417, ASSN:0021-8979, DOI: 10.1063/1.3452324.*

Wu Jiagang et al: "Multiferroic Behavior of BiFeO3-RTiO3 (Mg, Sr, Ca, Ba, and Pb) Thin Films", Journal of Applied Physics, American Institutes of Physics. New York, US, vol. 108, No. 2, Jul. 21, 2010, pp. 26101-26101, XPO12142417, ISSN: 0021-8979, DOI: 10.1063/1.3452324.

Hongri Liu et al: "Ferroelectricity of Highly Preferentially Oriented (BiFeO3)1-x-(BaTiO3)x Solid Solution Film by Sol-Gel Method", Journal of Sol-Gel Science and Technology, Kluwer Academic Publishers, BO, vol. 57, No. 1, Sep. 2, 2010, pp. 1-5, XP019871158, ISSN: 1573-4846, DOI: 10.1007/S10971-010-2313-7.

Gheorghiu F P et al: "Preparation and Properties of (1-x)BiFeO3-xBaTiO3 Multiferroic Ceramics", Journal of Alloys and Compounds, Elsevier Sequoia, Lausanne, CH, vol. 506, No. 2, Sep. 17, 2010, pp. 862-867, XP027273779, ISSN: 0925-8388.

European Search Report dated Jul. 24, 2013 for European Patent Application No. 11192843.8.

* cited by examiner

*Primary Examiner* — Matthew Luu
*Assistant Examiner* — Erica Lin
(74) *Attorney, Agent, or Firm* — Workman Nydegger

(57) ABSTRACT

A liquid ejecting head includes a pressure generating chamber communicating with a nozzle aperture, and a piezoelectric element including a piezoelectric layer and electrodes that apply a voltage to the piezoelectric layer. The piezoelectric layer is made of a complex oxide having a perovskite structure. The piezoelectric layer contains bismuth, barium, iron and titanium. The piezoelectric layer has an intensity ratio of a (111) orientation intensity to a (100) orientation intensity of 3 or more.

12 Claims, 13 Drawing Sheets

LIQUID EJECTING HEAD, LIQUID EJECTING APPARATUS, PIEZOELECTRIC ELEMENT, AND PIEZOELECTRIC CERAMIC

BACKGROUND

This application claims priority to Japanese Application No. 2010-275640 filed Dec. 10, 2010 and to Japanese Application No. 2011-229048 filed Oct. 18, 2011, which applications are incorporated by reference in its entirety.

1. Technical Field

Embodiments of the invention relate to a liquid ejecting head, a liquid ejecting apparatus, a piezoelectric element, and a piezoelectric ceramic.

2. Related Art

An ink jet recording head used in an ink jet printer, as disclosed in JP-A-2008-211140, is known as a liquid ejecting head used in a liquid ejecting apparatus. The liquid ejecting head includes piezoelectric elements. For the piezoelectric elements, PZT-based piezoelectric materials, such as lead zirconate titanate (expressed by the composition formula $Pb(Zr, Ti)O_3$, abbreviated as PZT), are used (JP-A-2008-211140).

Piezoelectric ceramics in which the lead content is reduced generally exhibit smaller strains than PZT-based piezoelectric ceramics. In recent years, piezoelectric materials containing perovskite oxides have been considered as an alternative to PZT-based piezoelectric materials, from the viewpoint of protecting the environment. Accordingly, a liquid ejecting head which includes a piezoelectric element using a piezoelectric ceramic having a reduced lead content and that is improved in strain and reliability is desired.

SUMMARY

An advantage of some aspects of the invention is that embodiments provide a liquid ejecting head including a piezoelectric element using a piezoelectric ceramic. Embodiments of the invention reduce the impact on the environment in part by reducing lead content that is present in PZT-based piezoelectric materials. Embodiments also advantageously exhibit, an increased strain and enhanced reliability. Embodiments advantageously provide a liquid ejecting apparatus that includes the liquid ejecting head including the piezoelectric element using the piezoelectric ceramic.

According to an aspect of the invention, a liquid ejecting head is provided. The liquid ejecting head includes a pressure generating chamber communicating with a nozzle aperture. The liquid ejecting head also includes a piezoelectric element that includes a piezoelectric layer and electrodes that apply a voltage to the piezoelectric layer. The piezoelectric layer is made of or formed of a complex oxide having a perovskite structure, and contains, in one embodiment, bismuth, barium, iron and titanium. An intensity ratio of the (111) orientation intensity to the (100) orientation intensity of the piezoelectric layer may be 3 or more.

The piezoelectric element in the liquid ejecting head exhibits a small environmental load or has a small adverse effect on the environment, an increased strain and enhanced reliability.

In the liquid ejecting head, the ratio of the bismuth content to the barium content in the complex oxide may be in the range of 70/30 to 80/20.

The piezoelectric layer may be oriented only in the (111) plane.

Thus, the piezoelectric element in the liquid ejecting head exhibits an increased strain.

In the liquid ejecting head, the electrodes may include a first electrode disposed on the pressure generating chamber side of the piezoelectric layer, and a second electrode opposing the first electrode with the piezoelectric layer therebetween.

The first electrode may include a plurality of conductive layers. The conductive layer closest to the piezoelectric layer may be made of a conductive strontium compound. The conductive strontium compound may be strontium ruthenate.

Alternatively, the conductive strontium compound may be strontium titanate containing niobium.

The conductive strontium compound may be preferentially oriented in the (111) plane.

The liquid ejecting head may also include a silicon substrate between the pressure generating chamber and the piezoelectric element.

The complex oxide may contain at least one additional element selected from the group consisting of manganese, cobalt, nickel, aluminum, zinc, and titanium.

The complex oxide may be in a pseudo-cubic system.

According to another aspect of the invention, a liquid ejecting apparatus including the above liquid ejecting head is provided.

The piezoelectric element in the liquid ejecting apparatus exhibits a small environmental load, an increased strain and enhanced reliability.

According to still another aspect of the invention, a piezoelectric element is provided which includes a piezoelectric layer. The piezoelectric element also includes electrodes that apply a voltage to the piezoelectric layer. The piezoelectric layer may be made of a complex oxide having a perovskite structure and may contain bismuth, barium, iron and titanium. The piezoelectric layer has an intensity ratio of the (111) orientation intensity to the (100) orientation intensity of 3 or more.

Thus, the piezoelectric element exhibits a small environmental load or impact, an increased strain and enhanced reliability.

In the piezoelectric element, the ratio of the bismuth content to the barium content in the complex oxide may be in the range of 70/30 to 80/20.

The piezoelectric layer of the piezoelectric element may be oriented only in the (111) plane.

In the piezoelectric element, the electrodes may include a first electrode, and a second electrode opposing the first electrode with the piezoelectric layer therebetween. The first electrode may include a plurality of conductive layers. The conductive layer closest to the piezoelectric layer may be made of a conductive strontium compound.

The conductive strontium compound may be strontium ruthenate.

Alternatively, the conductive strontium compound may be strontium titanate containing niobium.

The conductive strontium compound may be preferentially oriented in the (111) plane.

The complex oxide may contain at least one additional element selected from the group consisting of manganese, cobalt, nickel, aluminum, zinc, and titanium.

The complex oxide may be in a pseudo-cubic system.

According to still another aspect of the invention, a piezoelectric ceramic is provided which contains a complex oxide having a perovskite structure. The piezoelectric ceramic may contain bismuth, barium, iron, and titanium. The complex oxide has an intensity ratio of the (111) orientation intensity to the (100) orientation intensity of 3 or more.

Thus, the piezoelectric ceramic exhibits a small environmental load or impact, an increased strain and enhanced reliability.

According to another aspect of the invention, a piezoelectric element is provided. The piezoelectric element includes a piezoelectric layer made of a complex oxide having a perovskite structure. The piezoelectric layer may contain bismuth, barium, iron and titanium and may have an intensity ratio of a (111) orientation intensity to a (100) orientation intensity of 3 or more. The piezoelectric element may also include electrodes that apply a voltage to the piezoelectric layer.

In the piezoelectric element, a composition ratio of the bismuth to the barium in the complex oxide is in a range of 70/30 to 80/20. The piezoelectric layer may be oriented only in the (111) plane. In one example, the complex oxide contains at least one additional element selected from a group consisting of manganese, cobalt, nickel, aluminum, zinc, and titanium. Also, the complex oxide may be in a pseudo-cubic system.

The electrodes may include a first electrode disposed on a pressure generating chamber side of the piezoelectric layer, and a second electrode opposing the first electrode with the piezoelectric layer therebetween. The first electrode may include a plurality of conductive layers and a conductive layer closest to the piezoelectric layer may be made of a conductive strontium compound.

For example, the conductive strontium compound may be strontium ruthenate or strontium titanate containing niobium. The conductive strontium compound is preferentially oriented in the (111) plane.

In addition, the piezoelectric element may include a silicon substrate between a pressure generating chamber and the piezoelectric element.

The piezoelectric element according to claim 1, wherein the complex oxide is in a pseudo-cubic system.

The piezoelectric element may be included in a liquid ejecting head and the liquid ejecting head can be included in a liquid ejecting apparatus.

Thus, the piezoelectric element exhibits a small environmental load or impact, an increased strain and enhanced reliability.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Figure 1:
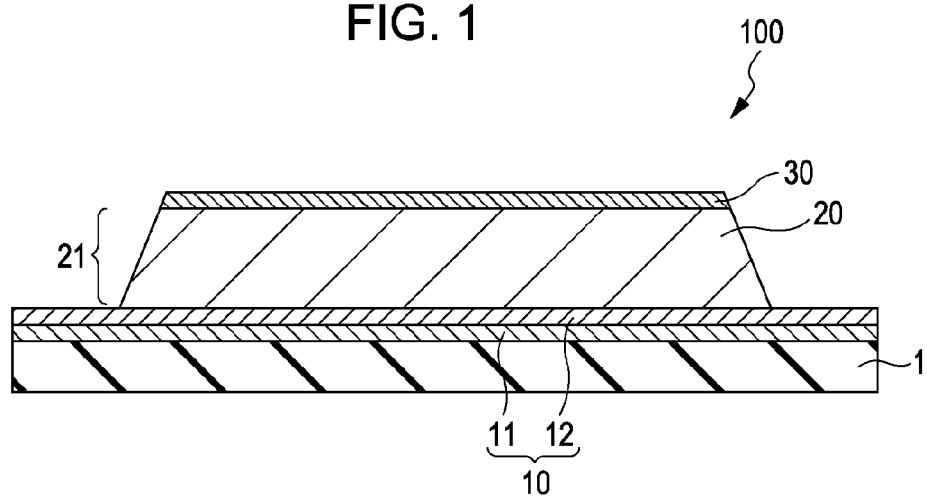
FIG. 1 depicts a schematic sectional view of a piezoelectric element according to an embodiment of the invention.

Embodiments of the invention will now be described with reference to the drawings.

1. PIEZOELECTRIC CERAMIC

A piezoelectric ceramic according to an embodiment of the invention will now be described. The piezoelectric ceramic of the present embodiment mainly contains a complex oxide having a perovskite crystalline structure. The piezoelectric ceramic may contain impurities that may be inevitably added in the manufacturing process. In the present embodiment, the complex oxide is expressed by the general formula $ABO_3$, and the ratio of the total moles of the element in the A site, the total moles of the element in the B site and the moles of oxygen is normally 1:1:3. The ratio may deviate from 1:1:3 within a range in which a perovskite structure can be formed.

In the complex oxide having a perovskite structure of the present embodiment, the A site contains bismuth (Bi) and/or barium (Ba), and the B site contains iron (Fe) and/or titanium (Ti). At least part of the complex oxide may be in a solid solution of a mixed crystal-ceramic containing bismuth ferrite ($BiFeO_3$) and barium titanate ($BaTiO_3$) (hereinafter may be referred to as a BFO-BT ceramic).

Additional elements, such as manganese (Mn) or cobalt (Co) by way of example only, may be added (for example, in a proportion of about 10% by mole or less) to the complex oxides disclosed herein. The addition of these or other elements may improve the characteristics of the complex oxides. The complex oxide of the present embodiment may thus contain an additional element such as manganese or cobalt.

For example, manganese (Mn) may be additionally added to the complex oxide of the present embodiment or of other embodiments. Other additional elements that may be added to embodiments of the complex oxide include, but are not limited to, cobalt, chromium, aluminum, potassium, lithium, magnesium, calcium, strontium, vanadium, niobium, tantalum, molybdenum, tungsten, nickel, zinc, silicon, lanthanum, cerium, praseodymium, promethium, samarium, and europium or any combination thereof.

In the complex oxide of the present embodiment, when the ratio of bismuth to the total elements in the A site is x ($0<x<1$), the bismuth ratio x may satisfy the relationship $0.7 \leq x \leq 0.8$. Also when the ratio of titanium to the total elements in the B site is y ($x+y=1$, $0<y<1$), the titanium ratio y may satisfy the relationship $0.2 \leq y \leq 0.3$. In other words, when the composition ratio of bismuth (Bi) to barium (Ba) is represented as $X_{Bi/Ba}$, the relationship $70/30 \leq X_{Bi/Ba} \leq 80/20$ can hold true. The ratio between the elements in the A site is similar to a relationship between the ratio of the elements in the B site. In one embodiment the ratio between bismuth and barium may be similar to the ratio between bismuth and titanium.

Hence, the complex oxide of the present embodiment may have a perovskite structure expressed by the following general formula (1) below and satisfy the relationships $0.7 \leq x \leq 0.8$, $0.2 \leq y \leq 0.3$, and $x+y=1$. In the general formula (1), M represents an additional element, such as manganese or cobalt. In the general formula (1), the additional element is added in a proportion of 5 mol % relative to iron (Fe). However, the content of the additional element M is not limited to this value, and may be appropriately adjusted within the range in which advantageous effects are produced.

$$(Bi_x, Ba_y)(Fe_{0.95x}, M_{0.05x}, Ti_y)O_3 \qquad (1)$$

For example, JP-A-2010-254560 reports that BFO-BT ceramic ($xBiFeO_3$-$yBaTiO_3$) satisfying $0.7 \leq x \leq 0.8$, $0.2 \leq y\ 0.3$ and $x+y=1$ crystallizes in a pseudo-cubic system, and that other BFO-BT ceramics crystallize in a rhombohedral system. Accordingly, it is expected that the BFO ceramic complex oxide of the present embodiment can be in a pseudo-cubic system and exhibit high practicability by controlling the composition of general formula (1) so as to satisfy $0.7 \leq x \leq 0.8$ and $0.2 \leq y \leq 0.3$. Therefore, the bismuth content and the titanium content in the complex oxide of the present embodiment may be selected such that the complex oxide can crystallize in a pseudo-cubic system.

The complex oxide of the present embodiment is a piezoelectric ceramic whose orientation has been controlled in the manufacturing process. In one example, an intensity ratio $\gamma (=\alpha/\beta)$ of the (111) orientation intensity $\alpha$ to the (100) orientation intensity $\beta$ of the piezoelectric ceramic is 3 or more. Thus, the strain and the reliability of the piezoelectric ceramic can be increased. This will be described in detail later.

The piezoelectric ceramic may be preferentially oriented in the (111) plane at a rate of 90% or more. Also, the orientation intensity ratio $\gamma$ of the piezoelectric ceramic may be infinite. In other words, the piezoelectric ceramic may be oriented only in the (111) plane. Thus, the strain of the piezoelectric ceramic can be further increased. This will be described in detail later.

2. PIEZOELECTRIC ELEMENT

A piezoelectric element according to an embodiment of the invention will now be described with reference to some of the drawings. FIG. 1 depicts a schematic sectional view of the piezoelectric element 100.

As shown in FIG. 1, the piezoelectric element 100 includes a piezoelectric layer 20 and electrodes 10 and 30 that apply a voltage to the piezoelectric layer 20. More specifically, the piezoelectric element 100 may include a first electrode 10, the piezoelectric layer 20, and a second electrode 30. The piezoelectric element 100 may be formed on a substrate 1. The electrodes include a first electrode 10 disposed closer to the substrate 1 (for example, pressure generating chamber 622 shown in FIG. 10), and a second electrode 20 opposing the first electrode 10 with the piezoelectric layer 20 therebetween, as shown in FIG. 1.

The substrate 1 may be a flat plate made of, for example, a conductive material, a semiconductor or an insulating material. The substrate 1 may be composed of a single layer or a plurality of layers. The substrate 1 may have any internal structure as long as the upper surface is flat, and may be a hollow plate. The substrate 1 may be a plate that can be deformed (bent) by the behavior of the piezoelectric layer 20, and may be called a vibration plate. The substrate 1 may be made of titanium oxide, zirconium oxide, aluminum oxide, or silicon oxide, and may have a multilayer structure made of these materials.

In one embodiment, a silicon substrate is used as the substrate 1. A silicon oxide coating may be formed over the surface of the silicon substrate 1. High-quality, inexpensive and stable silicon substrates are available. Such silicon substrates are advantageous from a commercial viewpoint. Accordingly, the use of a silicon substrate as the substrate 1 enhances the productivity and allows stable production.

The first electrode 10 is formed on the substrate 1. The first electrode 10 may be in the form of a layer or a thin film. The first electrode 10 may have a thickness, for example, in the range of 50 to 400 nm. A shape of the first electrode 10 is not particularly limited as long as the piezoelectric layer 20 can be disposed between the first electrode 20 and the opposing second electrode 30 in one embodiment. For example, the first electrode 10 may be rectangular or circular in plan view.

The first electrode 10 may include a plurality of conductive layers, as shown in FIG. 1. For example, the first electrode 10 includes at least a first conductive layer 11 and a second conductive layer 12. The second conductive layer 12 is the closest of the plurality of conductive layers to the piezoelectric layer 20. Another conductive layer (not shown) may be disposed between the first conductive layer 11 and the substrate 1.

The material of the first conductive layer 11 is not particularly limited as long as it is electrically conductive. Exemplary materials of the first electrode 11 include, by way of example and not limitation, metals such as Ni, Ir, Au, Pt, W, Ti, Cr, Ag, Pd and Cu, alloys of these metals, conductive oxides of these metals such as iridium oxide, complex oxides of Sr and Ru, and complex oxides of La and Ni.

The second conductive layer 12 may be made of a conductive strontium compound. For example, the conductive strontium compound may be strontium ruthenate (SRO) or strontium titanate (STO). If the conductive strontium compound is strontium titanate (STO), niobium (Nb) may be added.

If the second conductive layer 12 is made of strontium ruthenate, the thickness of the second conductive layer 12 may be in the range of 40 to 60 nm. In this instance, the second conductive layer 12 can be preferentially oriented in the (111) plane. The second conductive layer 12 may be preferentially oriented in the (111) plane at a rate of 90% or more, or may be oriented only in the (111) plane.

If the second conductive layer 12 is made of niobium-containing strontium titanate, the thickness of the second conductive layer 12 may be in the range of 5 to 15 nm. The niobium content in the strontium titanate may be in the range of 3% to 8%. In this instance, the second conductive layer 12 can be oriented in the (111) plane. The second conductive layer 12 may be oriented in the (111) plane at a rate of 90% or more, or may be oriented only in the (111) plane.

By forming the second conductive layer 12 of a conductive strontium compound so as to be located closest to the piezoelectric layer 20, the piezoelectric ceramic can have an intensity ratio $\gamma(=\alpha/\beta)$ of the (111) orientation intensity $\alpha$ to the orientation intensity $\beta$ of 3 or more. This will be described in detail later.

Although the second conductive layer 12 is disposed over the surface of the first conductive layer 11 in the embodiment shown in FIG. 1, the second conductive layer 12 may be continuously formed on the substrate 1 if the first conductive layer 11 is not provided.

One of the functions of the first electrode is to form a pair with the second electrode 30 so as to act as one of the electrodes (for example, a lower electrode under the piezoelectric layer 20) for applying a voltage to the piezoelectric layer 20.

The substrate 1 may not include a vibration plate. The first electrode 10 may act as the vibration plate in some embodiments. In other words, the first electrode 10 may have a function as one of the electrodes for applying a voltage to the piezoelectric layer 20 and a function as a vibration plate that can be deformed by the behavior of the piezoelectric layer 20.

The first electrode 10 and the substrate 1 may be separated by an additional layer (not shown), such as a layer enhancing the adhesion between the first electrode 10 and the substrate 1 or a layer enhancing strength or imparting conductivity. Such a layer may be made of, for example, a metal, such as titanium, nickel, iridium or platinum, or an oxide of these metals.

The piezoelectric layer 20 is formed on the first electrode 10 (or the second conductive layer 12). The piezoelectric layer 20 may be in the form of a layer or a thin film. The piezoelectric layer 20 may have a thickness, for example, in the range of 300 to 1500 nm. The piezoelectric layer 20 can be deformed by applying an electric field from the first electrode 10 and the second electrode 30 (electromechanical conversion).

The piezoelectric layer 20 is made of the piezoelectric ceramic described in "1. Piezoelectric Ceramic". The piezoelectric element 100 exhibits a small environmental load or has a reduced impact on the environment in part by reducing lead content and exhibits improved characteristics in strain and reliability.

In FIG. 1, the piezoelectric layer 20 has an active region 21 between the electrodes 10 and 30. In the piezoelectric element 100, the intensity ratio $\gamma(=\alpha/\beta)$ of the (111) orientation intensity $\alpha$ to the (100) orientation intensity $\beta$ of the piezoelectric layer 20 is 3 or more in one embodiment. The piezoelectric layer 20 may be preferentially oriented in the (111) plane at a rate of 90% or more. Also, the orientation intensity ratio $\gamma$ of the piezoelectric layer 20 may be infinite. In other words, the piezoelectric element 20 may be oriented only in the (111) plane.

The second electrode 30 is formed on the piezoelectric layer 20. The second electrode 30 may be in the form of a layer or a thin film. The second electrode 30 may have a thickness, for example, in the range of 50 to 300 nm. The shape of the second electrode 30 is not particularly limited, and may be rectangular or circular in plan view. The second electrode 30 can be formed of the materials enumerated as the materials of which the first electrode 10 can be formed.

One of the functions of the second electrode 30 is to form a pair with the first electrode 10 so as to act as one of the electrodes (for example, an upper electrode disposed over the piezoelectric layer 20) for applying a voltage to the piezoelectric layer 20.

Although the second electrode 30 is disposed over the surface of the piezoelectric layer 20 in the embodiment shown in FIG. 1, the second electrode 30 may be disposed not only on the upper surface of the piezoelectric layer 20, but also on the side surfaces of the piezoelectric layer 20.

The piezoelectric element 100 may be used in a liquid ejecting head or a liquid ejecting apparatus (e.g., an ink jet printer) including the liquid ejecting head as a piezoelectric actuator that pressurizes the liquid in the pressure generating chamber, or may be used as a piezoelectric sensor or the like that can detect the deformation of the piezoelectric layer 20 as electrical signals.

According to another aspect of the invention, a piezoelectric element is disclosed. The piezoelectric element includes a piezoelectric layer made of a complex oxide having a perovskite structure. The piezoelectric layer may contain bismuth, barium, iron and titanium and may have an intensity ratio of a (111) orientation intensity to a (100) orientation intensity of 3 or more. The piezoelectric element may also include electrodes that apply a voltage to the piezoelectric layer.

In the piezoelectric element, a composition ratio of the bismuth to the barium in the complex oxide is in a range of 70/30 to 80/20. The piezoelectric layer may be oriented only in the (111) plane. In one example, the complex oxide contains at least one additional element selected from a group consisting of manganese, cobalt, nickel, aluminum, zinc, and titanium. Also, the complex oxide may be in a pseudo-cubic system.

The electrodes may include a first electrode disposed on a pressure generating chamber side of the piezoelectric layer, and a second electrode opposing the first electrode with the piezoelectric layer therebetween. The first electrode may include a plurality of conductive layers and a conductive layer closest to the piezoelectric layer may be made of a conductive strontium compound.

For example, the conductive strontium compound may be strontium ruthenate or strontium titanate containing niobium. The conductive strontium compound is preferentially oriented in the (111) plane.

In addition, the piezoelectric element may include a silicon substrate between a pressure generating chamber and the piezoelectric element.

The piezoelectric element according to claim 1, wherein the complex oxide is in a pseudo-cubic system.

The piezoelectric element may be included in a liquid ejecting head and the liquid ejecting head can be included in a liquid ejecting apparatus.

Thus, the piezoelectric element exhibits a small environmental load or impact, an increased strain and enhanced reliability.

3. METHOD FOR MANUFACTURING THE PIEZOELECTRIC ELEMENT

A method for manufacturing the piezoelectric element of the present embodiment will now be described with reference to some drawings.

As shown in FIG. 1, the first electrode 10 is formed on the substrate 1. The substrate 1 may be formed by forming a silicon oxide layer on a silicon substrate, and subsequently forming any of a titanium oxide layer, a zirconium oxide layer and an aluminum oxide layer or other suitable conductive layer on the silicon oxide layer. The silicon oxide layer may be formed by thermal oxidation. The zirconium oxide layer or the titanium oxide layer may be formed by sputtering.

The first electrode 10 can be formed by any known method without particular limitation. For example, the first conductive layer 11 and the second conductive layer 12 may be formed by a film forming method, such as spin coating, sputtering, vacuum vapor deposition, or metal organic chemical vapor deposition (MOCVD). The formation of the first electrode 10 can be performed by operations of drying, degreasing, heating for crystallization, and patterning, as required.

If the second conductive layer 12 is made of strontium ruthenate, it may be formed to a desired thickness by RF sputtering. This RF sputtering may be performed at a temperature in the range of 690 to 710° C. The RF power may be in the range of 50 to 100 W, and the sputtering gas pressure may be in the range of 1 to 5 Pa. In this manner, the second conductive layer 12 can be preferentially oriented in the (111) plane at a rate of 90%, or can be oriented only in the (111) plane (with a (111) orientation intensity ratio of substantially 100%).

If the second conductive layer 12 is formed of niobium-containing strontium titanate, a coating of the material is formed to a desired thickness by spin coating. The coating is then degreased at a temperature in the range of 300 to 400° C. In this instance, the coating of niobium-containing strontium titanate is not heated to be crystallized. Thus, an amorphous precursor coating of the second conductive layer 12 is formed.

The second conductive layer 12 is a layer disposed on a surface of the piezoelectric layer 20 and can act as a seed layer for controlling the orientation of the piezoelectric layer 20 to the (111) plane. The thickness of the second conductive layer 12 is not particularly limited, but may be in the range of 40 to 60 nm.

Subsequently, the piezoelectric layer 20 is formed of the piezoelectric ceramic of the present embodiment on the first electrode 10 and more particularly on the second conductive layer 12. The piezoelectric layer 20 may be formed by sputtering, laser ablation or MOCVD, or a liquid-phase process such as a sol gel method or metal organic deposition (MOD). The crystallization of the piezoelectric layer 20 is performed at a temperature of, for example, in the range of 500 to 850° C.

In order to form the piezoelectric layer 20 to a desired thickness, a sequence of operations for forming a precursor layer and drying and degreasing the precursor layer may be repeated. For example, a first piezoelectric sub-layer may be formed by forming a first precursor layer to a thickness of 70 to 80 nm, and then drying and degreasing the first precursor layer in stages for firing at a temperature of 180 to 360° C.

After forming the first piezoelectric sub-layer, a plurality of precursor layers may be formed and then fired (crystallized). More specifically, after the formation of the first piezoelectric sub-layer, a second precursor layer and a third precursor layer may be formed under the same conditions as the first precursor layer, and then fired at a crystallization temperature to form a second and a third piezoelectric sub-layer. As with the second and third precursor layers, a fourth precursor layer and subsequent precursor layers may be formed in twos, and then fired at a crystallization temperature. Thus, a plurality of piezoelectric sub-layers may be formed for forming the piezoelectric layer 20 having a desired thickness. Consequently, the orientation of the piezoelectric layer 20 can be controlled with more certainty.

In the above operation, the drying and degreasing performed in stages means increasing temperature step by step. For example, temperature may be increased in three steps: a first temperature of 150 to 200° C., a second temperature of 210 to 290° C., and a third temperature of 300 to 360° C. Consequently, the orientation of the piezoelectric layer 20 can be controlled with more certainty.

Subsequently, the second electrode 30 is formed on the piezoelectric layer 20. The second electrode 30 may be formed by sputtering, vacuum vapor deposition, or MOCVD. Then, the second electrode 30 and the piezoelectric layer 20 are patterned into a desired shape. The patterning of the second electrode 30 and the piezoelectric layer 20 may be performed at one time or in different steps.

The piezoelectric layer 20 and the second electrode 30 have the above-described structure. In the piezoelectric layer 20, the orientation of the piezoelectric sub-layer formed and crystallized on the second conductive layer 12 of the first electrode 10 is controlled by the second conductive layer 12 so that the intensity ratio $\gamma(=\alpha/\beta)$ of the (111) orientation intensity $\alpha$ to the (100) orientation intensity $\beta$ is 3 or more.

Through the above-described operations, a piezoelectric element 100 can be produced which exhibits a small environmental load, an increased strain and enhanced reliability.

In addition, by producing the piezoelectric element 100 in the above-described process, the piezoelectric ceramic can be controlled to the above-described orientation. It is technologically difficult to control the orientation of BFO-BT ceramics to the (111) plane in ordinary processes. BFO-BT ceramics are generally oriented in the (110) and (100) planes. Accordingly, it has been technically difficult, from a viewpoint of productivity, to produce a (111) oriented piezoelectric ceramic layer on a silicon substrate in commercial production processes. This will be described later.

4. EXAMPLES

Embodiments of the present invention will be further described in detail with reference to Examples 1 to 6 and Comparative Examples 1 to 6. However, embodiments of the invention are not limited to the following Examples. The following Examples include Examples of piezoelectric elements.

4.1. EXAMPLES

Example 1

First, a substrate was produced according to the following process. A silicon dioxide layer was formed on a monocrystalline silicon substrate by thermal oxidation. Subsequently, a 20 nm thick titanium layer was formed on the silicon dioxide layer by DC sputtering. The titanium layer was then thermally oxidized to form a titanium oxide layer. A 150 nm thick platinum layer was formed on the titanium oxide layer by DC sputtering to form a first conductive layer. A 50 nm strontium ruthenate second conductive layer was formed on the first conductive layer by RF sputtering. The RF sputtering was performed at 700° C., an RF power of 50 W and a sputtering gas pressure of 2 Pa.

Subsequently, a piezoelectric layer was formed on the first electrode by a liquid phase process on the second conductive layer of the first electrode as explained below.

First, a material solution of the piezoelectric layer was prepared. The material solution was applied onto the first electrode by spin coating (coating). The substrate was rotated at 500 rpm for 5 seconds, and further rotated at 2500 rpm for 30 seconds. The material solution was a mixture of known metal alkoxides or organic metal salts containing bismuth, barium, iron and titanium and an additional element manganese in a solvent (n-octane).

Subsequently, the substrate was dried for 3 minutes on a hot plate of 150° C. (drying), and was then degreased for 6 minutes on a hot plate of 350° C. (degreasing). A sequence of the operations of coating, drying and degreasing was repeated twice. Then, the resulting coating was annealed (crystallization) to form a thin piezoelectric sub-layer in an oxygen atmosphere at 650° C. for 5 minutes. This sequence for forming the thin piezoelectric sub-layer was repeated 6 times. Thus, a piezoelectric layer made of a complex oxide expressed by the following general formula (x=0.75, y=1−x=0.25) was formed. The thickness of the piezoelectric layer was 600 nm.

$$(Bi_x,Ba_y)(Fe_{0.95x},M_{0.05x},Ti_y)O_3 \qquad (2)$$

Subsequently, a 100 nm thick platinum layer (second electrode) was formed on the piezoelectric layer by DC sputtering through a metal mask having an opening of 500 μm in diameter.

Example 2

In Example 2, the second conductive layer closest to the piezoelectric layer was formed of strontium titanate containing 5% of niobium. After forming the first conductive layer, strontium titanate containing 5% of niobium was deposited to a thickness of 5 nm on the first conductive layer by spin coating. The substrate on which the niobium-containing strontium titanate layer had been formed was dried for 3 minutes on a hot plate of 150° C. (drying), and was then degreased for 6 minutes on a hot plate of 350° C. (degreasing). An amorphous precursor coating of the second conductive layer was thus formed. A piezoelectric layer was formed on the precursor coating. The other operations were performed in the same manner as in Example 1, except for the above operation for forming the second conductive layer.

Example 3

In Example 3, a piezoelectric layer was formed in the following process after the substrate including the first electrode and the material solution were prepared in the same manner as in Example 1.

First, the material solution was applied onto the first electrode by spin coating so as to form a 70 nm precursor coating (coating). The substrate was rotated at 500 rpm for 5 seconds, and further rotated at 3000 rpm for 30 seconds.

Then, the substrate was dried and degreased in stages on a hot plate. For the drying and degreasing, the first step was performed at a first temperature of 180° C. for 120 seconds, the second step was performed at a second temperature of 250° C. for 120 seconds, and the third step was performed at a third temperature of 350° C. for 120 seconds.

Then, the coating was annealed to form a 70 nm first piezoelectric sub-layer in an oxygen atmosphere at 700° C. for 5 minutes. Subsequently, a sequence of the operations of successively forming two precursor coatings of piezoelectric sub-layers and crystallizing the precursor coatings under the same conditions as above was repeated six times. Thus, a piezoelectric layer having a thickness of 1200 nm was formed.

Example 4

In Example 4, a material solution was prepared for a piezoelectric layer in which the complex oxide after firing would have a composition expressed by the above general formula (2) with x=0.80 and y=1−x=0.20. The other operations were performed in the same manner as in Example 3, except for the above operation for preparing the material solution.

Example 5

In Example 5, a material solution was prepared for a piezoelectric layer in which the complex oxide after firing would have a composition expressed by the above general formula (2) with x=0.70 and y=1−x=0.30. The other operations were performed in the same manner as in Example 3, except for the above operation for preparing the material solution.

Example 6

In Example 6, a material solution was prepared for a piezoelectric layer in which the complex oxide after firing would have a composition expressed by the following general formula (3) with x=0.75 and y=1−x=0.25.

$$(Bi_x,Ba_y)(Fe_{0.95x},Co_{0.05x},Ti_y)O_3 \qquad (3)$$

In the present Example 6, cobalt (Co) was added as the additional element to the material solution to form the composition expressed by general formula (3), instead of manganese (Mn), which was added to the material solutions prepared in Examples 1 and 3. The other operations were performed in the same manner as in Example 3, except for the above operation for preparing the material solution.

Comparative Example 1

In Comparative Example 1, the first electrode was composed of a 130 nm thick platinum first conductive layer, and a piezoelectric layer was formed on the platinum layer without forming the second conductive layer. The other operations for preparing the piezoelectric element were performed in the same manner as in Example 1, except that the second conductive layer was not formed.

Comparative Example 2

In Comparative Example 2, the second conductive layer was formed of strontium ruthenate, as in Example 1. In Comparative Example 2, a 50 nm thick strontium ruthenate layer was formed on the first conductive layer by RF sputtering. The RF sputtering was performed at 650° C., an RF power of 50 W and a sputtering gas pressure of 2 Pa. The other operations were performed in the same manner as in Example 1, except for the above operation for forming the second conductive layer.

Comparative Example 3

In Comparative Example 3, the second conductive layer was formed of niobium-containing strontium titanate, as in Example 2. In Comparative Example 3, the substrate on which the strontium titanate layer had been formed was dried for 3 minutes on a hot plate of 150° C. (drying), and was then degreased for 6 minutes on a hot plate of 350° C. (degreasing). Then, the strontium titanate layer was annealed (crystallization) to form a second conductive layer of the first electrode in an oxygen atmosphere at 650° C. for 5 minutes. Thus the second conductive layer was provided. A piezoelectric layer was formed on the second conductive layer. The other operations were performed in the same manner as in Example 2, except for the above operation for forming the second conductive layer.

Comparative Example 4

In Comparative Example 4, a 40 nm thick $LaNiO_3$ (LNO) second conductive layer of the first electrode was formed, and a piezoelectric layer was formed on the LNO layer. The piezoelectric layer was formed in the same manner as in Example 3.

Comparative Example 5

In Comparative Example 5, the first electrode was composed of a 130 nm thick platinum first conductive layer, and a piezoelectric layer was formed on the platinum layer without forming the second conductive layer. The other operations for preparing the piezoelectric element were performed in the same manner as in Example 3, except that the second conductive layer was not formed.

Comparative Example 6

In Comparative Example 6, a first piezoelectric sub-layer was formed after the substrate including the first electrode and the material solution were prepared, in the same manner as in Example 1. Then, in the operation for forming a plurality of precursor coatings and crystallizing the coatings to form a multilayer piezoelectric layer, a sequence of the operations of successively forming three precursor coatings and crystallizing the precursor coatings was repeated 4 times. Thus, a piezoelectric layer having a thickness of 1200 nm was formed.

4.2. X-ray Diffraction Analysis

X-ray diffraction patterns were measured at room temperature with "D8 Discover" manufactured by Bruker AXS. FIGS. 2-7 show the results of the X-ray diffraction pattern analysis of the piezoelectric layers of some of the Examples and the Comparative Examples.

Figure 2:
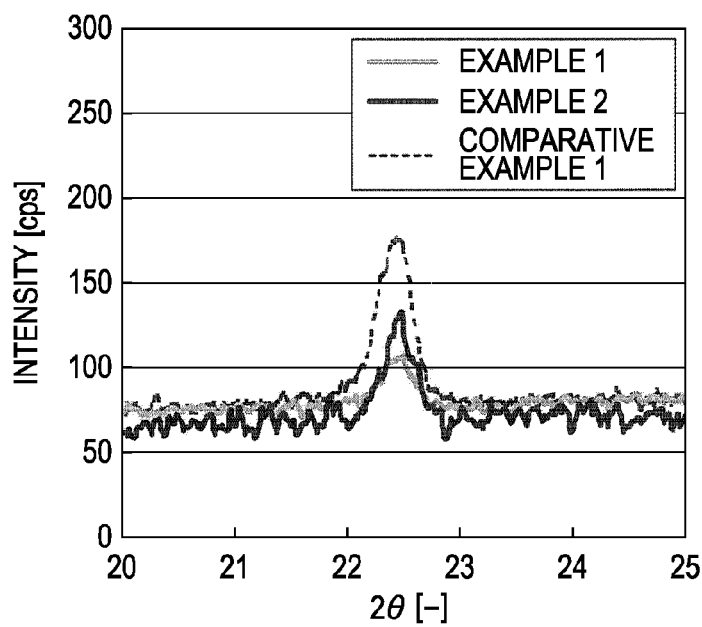
FIG. 2 illustrates a plot of the X-ray diffraction patterns of Examples 1 and 2 and Comparative Example 1.
Figure 3:
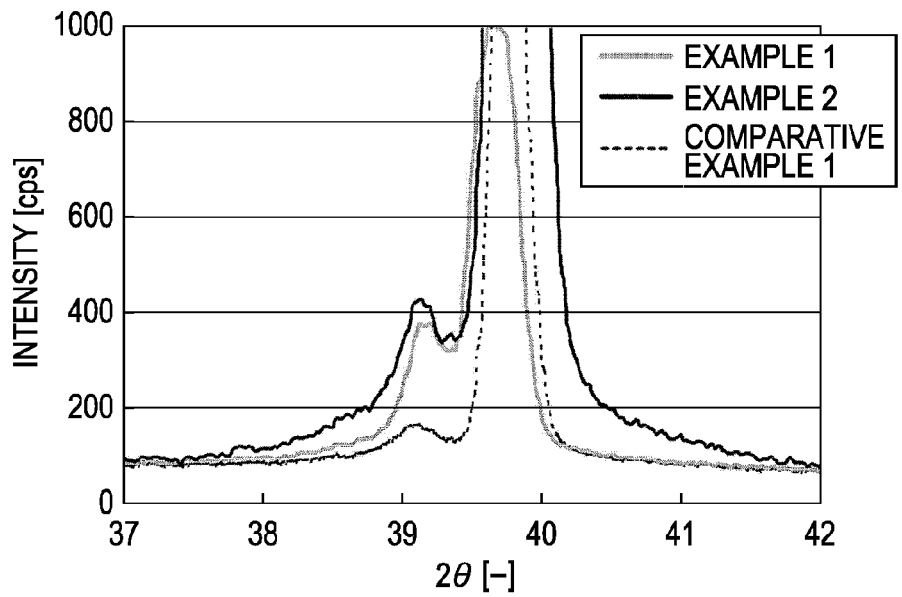
FIG. 3 illustrates a plot of the X-ray diffraction patterns of Examples 1 and 2 and Comparative Example 1.
Figure 4:
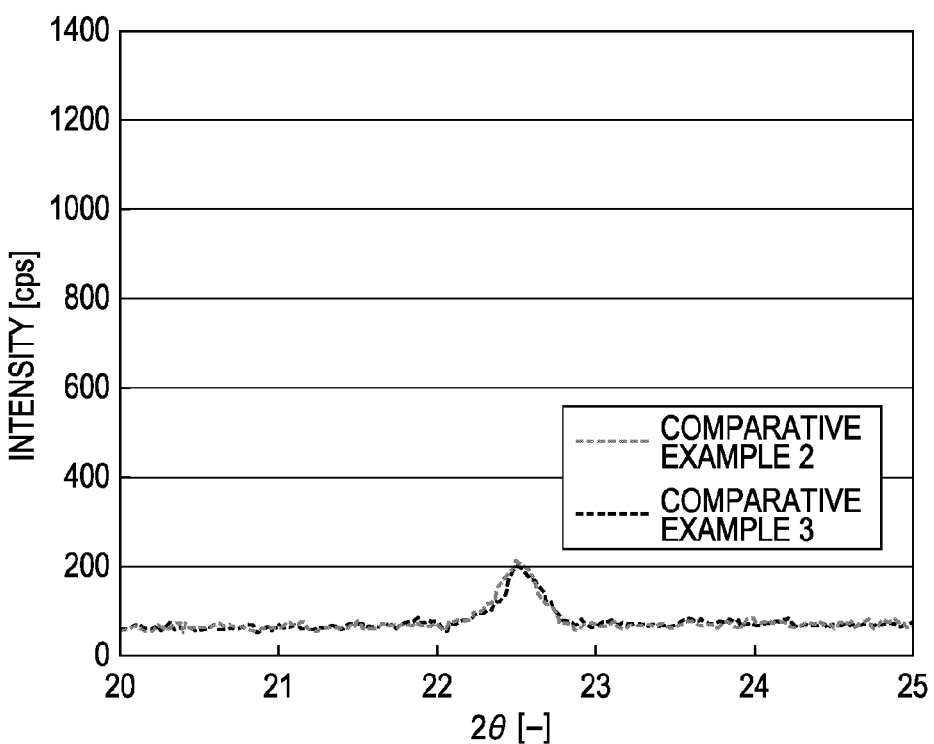
FIG. 4 illustrates a plot of the X-ray diffraction patterns of Comparative Examples 2 and 3.
Figure 5:
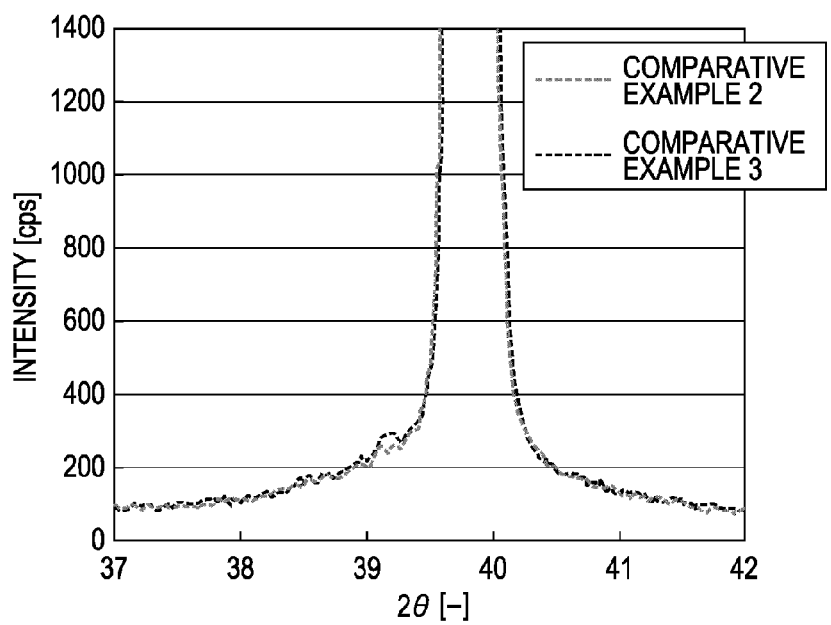
FIG. 5 illustrates a plot of the X-ray diffraction patterns of Comparative Examples 2 and 3.
Figure 6:
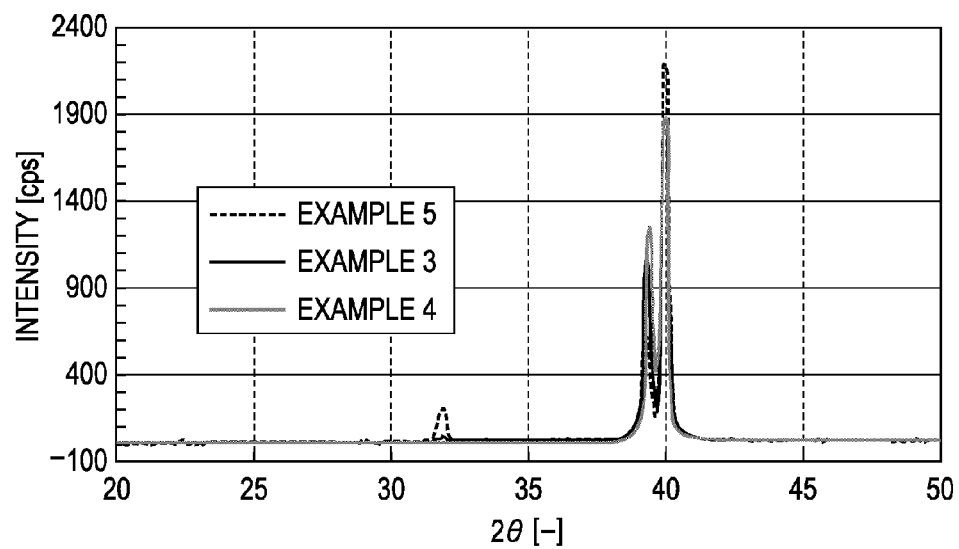
FIG. 6 illustrates a plot of the X-ray diffraction patterns of Examples 3 to 5.
Figure 7:
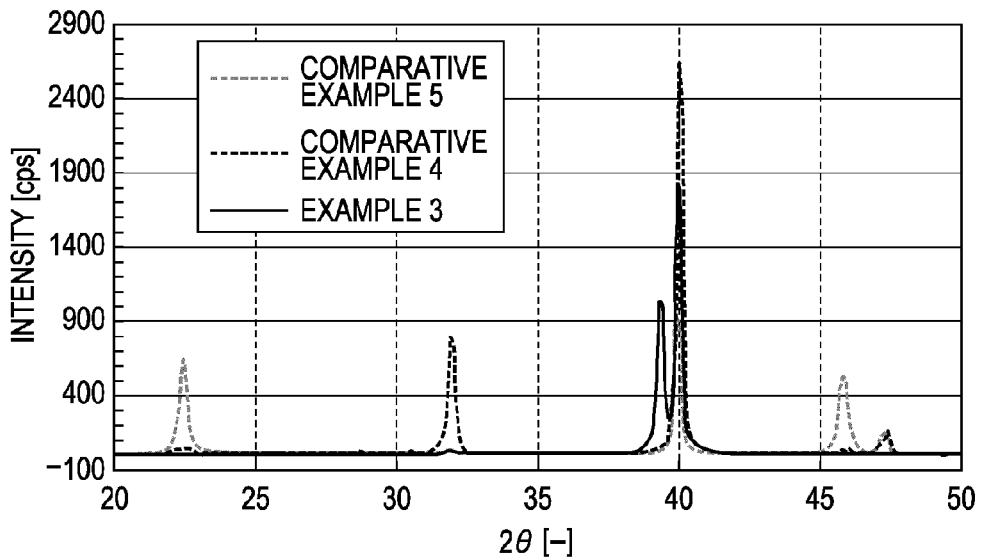
FIG. 7 illustrates a plot of the X-ray diffraction patterns of Example 3 and Comparative Examples 4 and 5.

More specifically, FIGS. 2 and 3 show the results of the X-ray diffraction pattern analysis of Examples 1 and 2 and Comparative Example 1. FIGS. 4 and 5 show the results of the X-ray diffraction pattern analysis of Comparative Examples 2 and 3. FIG. 6 shows the results of the X-ray diffraction pattern analysis of Examples 3 to 5. FIG. 7 shows the results of the X-ray diffraction pattern analysis of Example 3 and Comparative Examples 4 and 5.

The following Table shows the (111) orientation intensity α, the (100) orientation intensity β and the intensity ratio $\gamma(=\alpha/\beta)$ obtained from the results of the X-ray diffraction pattern analyses shown in FIGS. 2 to 7.

TABLE

| | (100) orientation intensity β | (111) orientation intensity α | (110) orientation intensity | Intensity ratio γ (α/β) |
|---|---|---|---|---|
| Example 1 | 103 | 363 | 0 | 3.524 |
| Example 2 | 137 | 412 | 0 | 3.007 |
| Example 3 | 0 | 1000 | 0 | Infinite |
| Example 4 | 0 | 1225 | 0 | Infinite |
| Example 5 | 0 | 615 | 203 | Infinite |
| Example 6 | 0 | 920 | 10 | Infinite |
| Comparative Example 1 | 175 | 170 | 0 | 0.975 |
| Comparative Example 2 | 210 | 257 | 0 | 1.224 |
| Comparative Example 3 | 210 | 283 | 0 | 1.348 |
| Comparative Example 4 | 655 | 0 | 0 | 0 |
| Comparative Example 5 | 20 | 1 | 808 | 0.05 |

As shown in FIG. 2 and the Table, the (100) orientation intensities β in Examples 1 and 2 and Comparative Example 1 were 103, 137 and 175, respectively. As shown in FIG. 3 and the Table, the (111) orientation intensities α of Examples 1 and 2 and Comparative Example 1 were 363, 412 and 170, respectively. Hence, the intensity ratios $\gamma(=\alpha/\beta)$ in Examples 1 and 2 were 3.524 and 3.007, respectively, and the intensity ratio γ of Comparative Example 1 was 0.971. Thus, the intensity ratios γ of the piezoelectric layers of the piezoelectric elements of Examples 1 and 2 were 3 or more.

As shown in FIG. 4 and the Table, the (100) orientation intensities β of Comparative Examples 2 and 3 were each 210. As shown in FIG. 5 and the Table, the (111) orientation intensities α of Comparative Examples 2 and 3 were 257 and 283, respectively. Hence, the intensity ratios γ of Comparative Examples 2 and 3 were 1.224 and 1.348, respectively. The results of Examples 1 and 2 and Comparative Examples 2 and 3 show that a piezoelectric layer formed on a second conductive layer formed of strontium ruthenate or niobium-containing strontium titanate under predetermined conditions has an orientation intensity ratio γ of 3 or more.

As shown in FIG. 6 and the Table, the (100) orientation was not observed in Examples 3 to 5. The (111) orientation intensities α of Examples 3 to 5 were 1000, 1225 and 615, respectively. Since the (100) orientation was not observed in Examples 3 to 5, the orientation intensity ratios γ of these Examples were 3 or more, and were substantially infinite.

As shown in FIG. 7 and the Table, the (100) orientation intensities β of Comparative Examples 4 and 5 were 655 and 20, respectively. Also, the (111) orientation intensities α of Comparative Examples 4 and 5 were 0 and 1, respectively. The (110) orientation intensities of Comparative Examples 4 and 5 were 0 and 808, respectively. Hence, the intensity ratios γ of Comparative Examples 4 and 5 were 0 and 0.05, respectively.

Thus, the piezoelectric layers in Comparative Examples 4 and 5 were preferentially oriented in the (100) plane and in the (110) plane, respectively, but not in the (111) plane. Accordingly, these examples demonstrate that it is technically difficult to preferentially orient the piezoelectric layer in the (111) plane with an orientation intensity ratio γ of 3 or more in the absence of the second conductive layer made of a conductive strontium compound.

The results of the X-ray diffraction analyses of the piezoelectric elements of Examples 1 to 5 and Comparative Examples 1 to 5 show that the piezoelectric layers formed of a BFO-BT ceramic according to the method described in "3. Method for Manufacturing the Piezoelectric Element" can be singly or preferentially oriented in the (111) plane with an orientation intensity ratio γ of 3 or more.

4.3. Evaluation of Strain and Hysteresis

The strain in the d33 direction and hysteresis were measured at 25° C. with a strain analyzer DBLI manufactured by aixACCT. The strain relates to the displacement of the piezoelectric layer according to an applied voltage.

Figure 8:
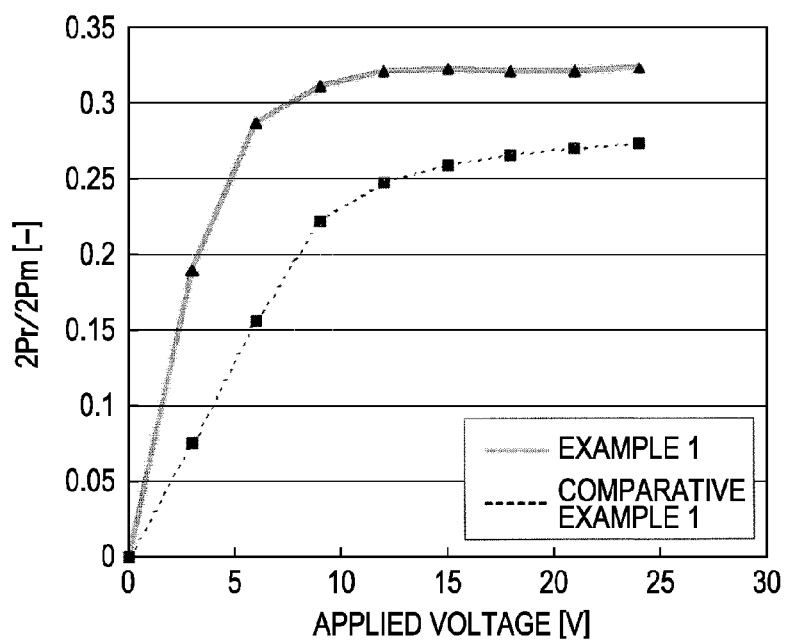
FIG. 8 illustrates a plot showing strains of the piezoelectric elements or layers of Example 1 and Comparative Example 1 for applied voltages.
Figure 9:
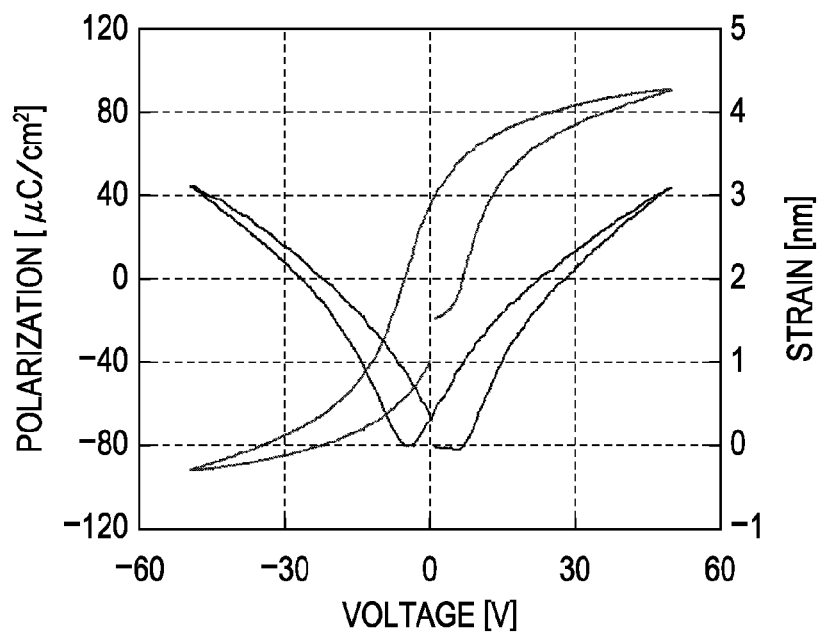
FIG. 9 illustrates a plot showing the dependence of the strain and the hysteresis of Example 1 on the applied voltage.
Figure 10:
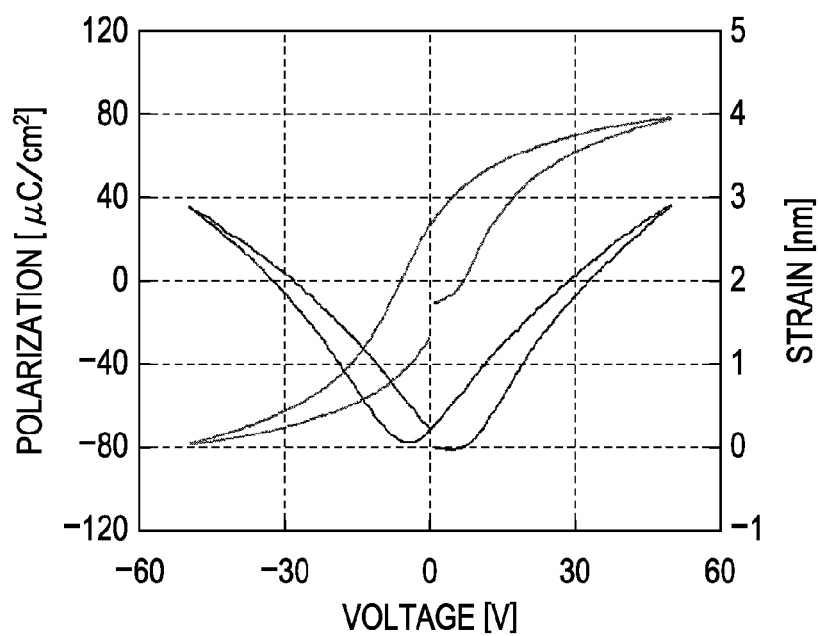
FIG. 10 illustrates a plot showing the dependence of the strain and the hysteresis of Comparative Example 1 on the applied voltage.

FIG. 8 shows the strains of the piezoelectric elements of Example 1 and Comparative Example 1 for applied voltages. FIG. 9 shows the dependences of the strain and the hysteresis of the piezoelectric element of Example 1 on the applied voltage. FIG. 10 shows the dependences of the strain and the hysteresis of the piezoelectric element of Comparative Example 1 on the applied voltage.

FIG. 8 shows that the strain of the piezoelectric element of Example 1 was increased relative to the strain of the piezoelectric element of Comparative Example 1. For example, the strain at an applied voltage of 30 V was increased about 20%.

In addition, FIGS. 9 and 10 show that the piezoelectric layer of the piezoelectric element of Example 1 had a better hysteresis than the hysteresis of the piezoelectric element of Comparative Example 1.

Figure 11:
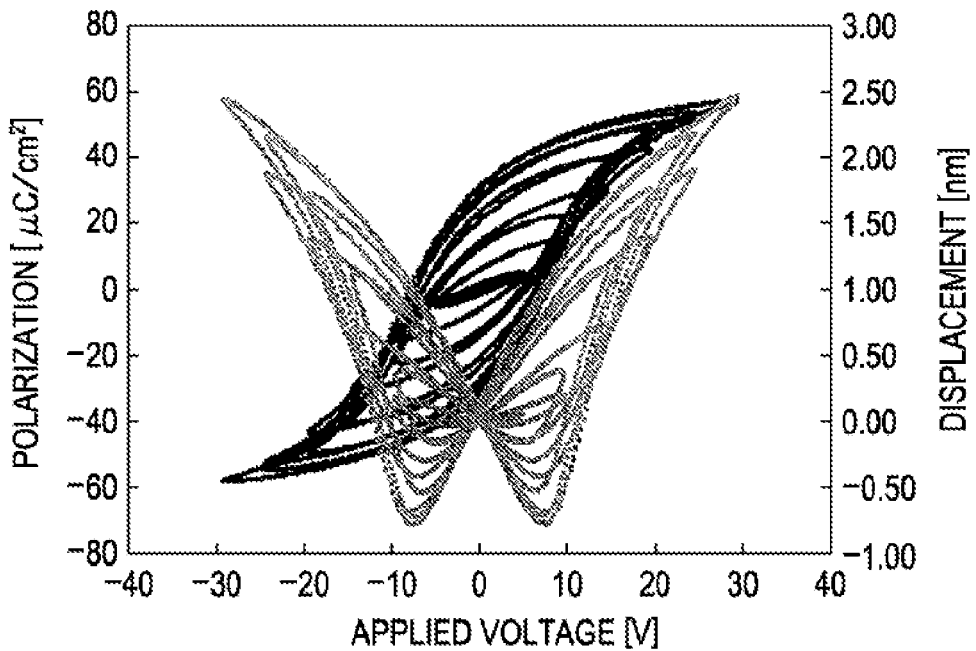
FIG. 11 illustrates a plot showing the dependence of the strain and the hysteresis of Example 3 on the applied voltage.
Figure 12:
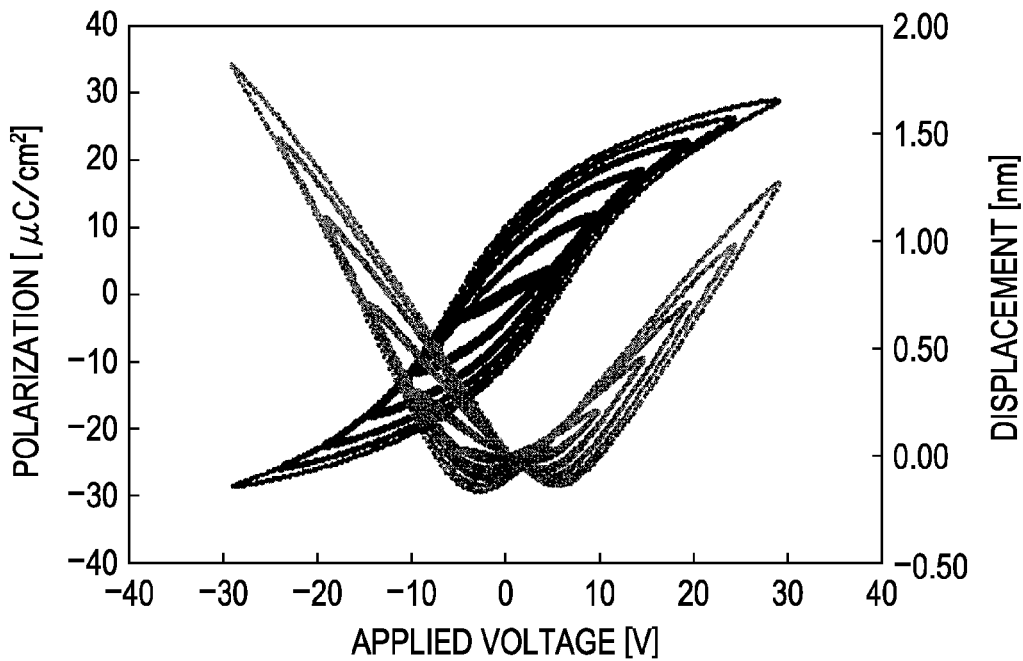
FIG. 12 illustrates a plot showing the dependence of the strain and the hysteresis of Comparative Example 4 on the applied voltage.
Figure 13:
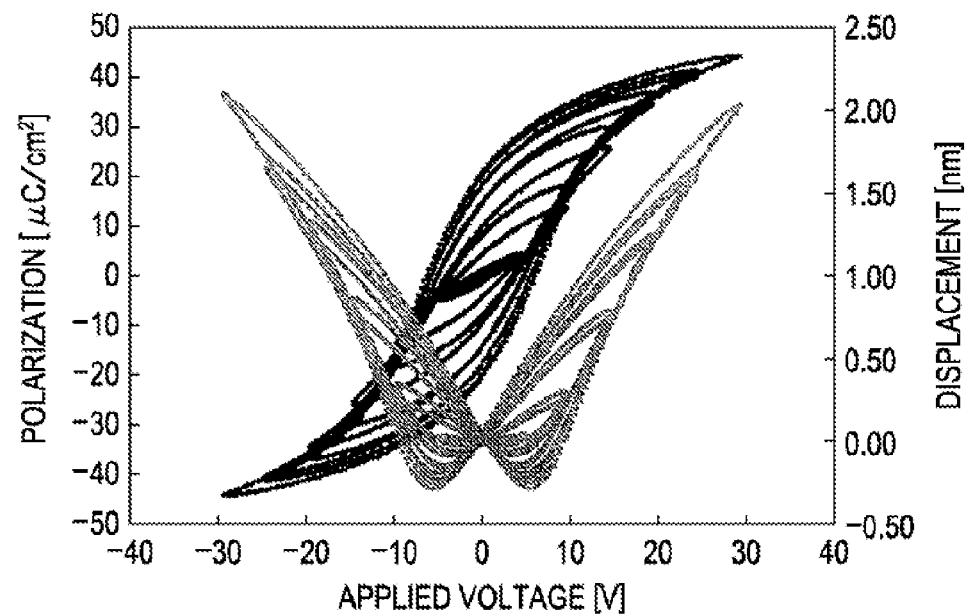
FIG. 13 illustrates a plot showing the dependence of the strain and the hysteresis of Comparative Example 5 on the applied voltage.

FIG. 11 shows the dependence of the strain and the hysteresis of the piezoelectric element of Example 3 on the applied voltage, FIG. 12 show the dependence of the strain and the hysteresis of the piezoelectric element of Comparative Example 4 on the applied voltage, and FIG. 13 shows the dependence of the strain and the hysteresis of the piezoelectric element of Comparative Example 5 on the applied voltage.

As shown in FIGS. 11 to 13, the strain of the piezoelectric element of Example 3 was 3.2 nm, while the strains of the piezoelectric elements of Comparative Examples 4 and 5 were 1.95 nm and 2.4 nm, respectively. Hence, the strain of the piezoelectric element of Example 3 was increased by about 64% relative to the strain of the piezoelectric element of Comparative Example 4, and by about 33% relative to the strain of the piezoelectric element of Comparative Example 5.

These results show that by using a piezoelectric layer controlled so as to be preferentially oriented in the (111) plane with an orientation intensity ratio γ of 3 or more as in Examples 1 and 3, the strain of the piezoelectric element can be increased by about 20% to 64% relative to the piezoelectric layer oriented in the (110) plane as in the piezoelectric element of Comparative Example 4 or in the (100) plane as in the piezoelectric element of Comparative Example 5, or relative to the piezoelectric layer having an orientation intensity ratio γ of less than 3 as in the piezoelectric element of Comparative Example 1.

Figure 14:
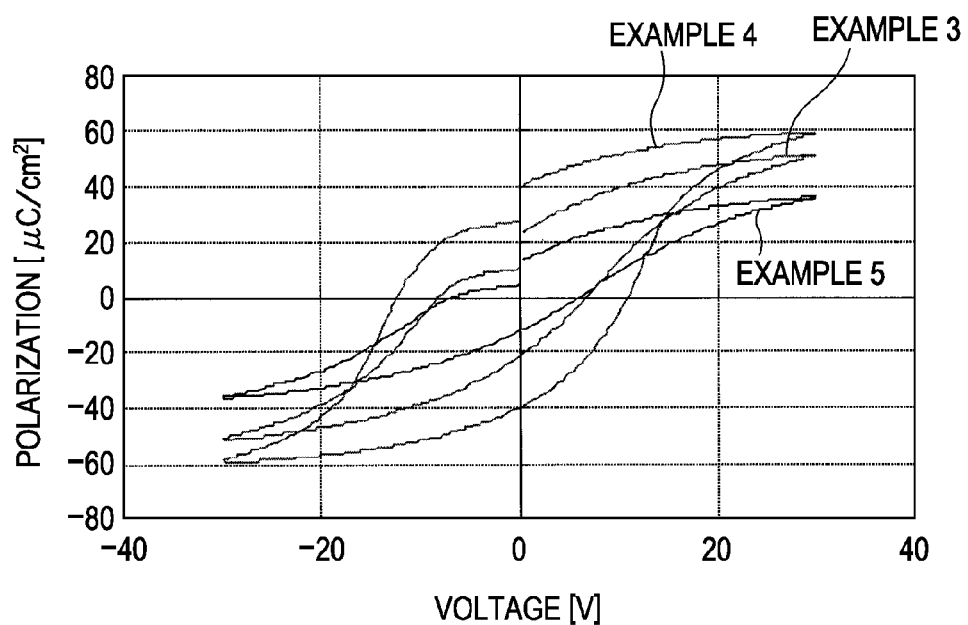
FIG. 14 illustrates a plot showing the dependence of the hysteresis of Examples 3 to 5 on the applied voltage.

FIG. 14 shows the dependencies of the hysteresis of the piezoelectric elements of Examples 3 to 5 on the applied voltage. In comparison with Example 5, in which the bismuth/barium composition ratio ($X_{Bi/Ba}$) was 70/30, and Example 3, in which the composition ratio $X_{Bi/Ba}$ was 75/25, the hysteresis curve of Example 4, which had a composition ratio $X_{Bi/Ba}$ of 80/20 and thus had a higher bismuth-containing BFO composition ratio than other Examples, exhibited an improved squareness.

Figure 15:
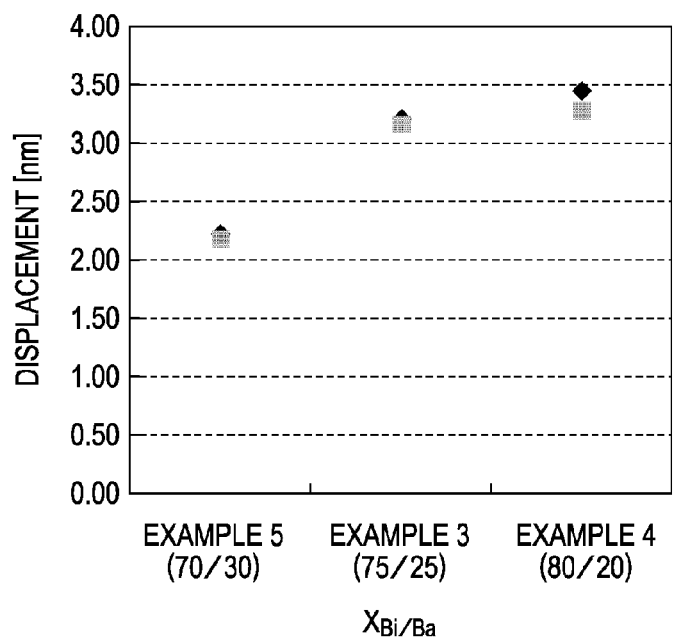
FIG. 15 illustrates a plot of the strains at an applied voltage of Examples 3 to 5.

FIG. 15 shows the strain or displacement (nm) of the piezoelectric elements of Examples 3 to 5 at an applied voltage of 30 V. The number N of strain measurements was 2. As shown in FIG. 15, the average strain of the piezoelectric element of Example 3 was 3.2 nm; the average strain of Example 4 was 3.4 nm; and the average strain of Example 5 was 2.2 nm. Thus, in comparison with Example 5, in which the composition ratio $X_{Bi/Ba}$ was 70/30, and Example 3, in which the composition ratio $X_{Bi/Ba}$ was 75/25, Example 4, which had a composition ratio $X_{Bi/Ba}$ of 80/20 and thus had a higher bismuth-containing BFO composition ratio than other Examples, exhibited a larger strain.

4.4. Evaluation of Withstand Voltage and Leakage Current

Figure 16:
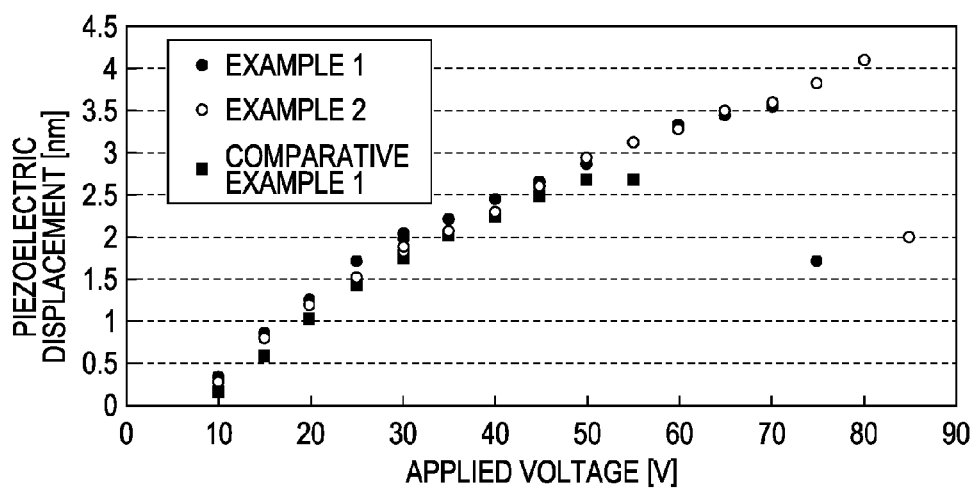
FIG. 16 illustrates a plot showing the resistance to an applied voltage of Examples 1 and 2 and Comparative Example 1.

FIG. 16 shows the results of a withstand voltage test performed on the piezoelectric elements of Examples 1 and 2 and Comparative Example 1. In other words, FIG. 16 shows the ability of the piezoelectric element to withstand higher voltages, which relates to reliability of the piezoelectric elements. In the plot, the horizontal axis represents the voltage (V) applied, and the vertical axis represents the piezoelectric displacement for the voltage.

As shown in FIG. 16, voltages up to 55 V were able to be applied to the piezoelectric element of Comparative Example 1, but a higher applied voltage increased the leakage current between the first electrode and the second electrode and thus caused short-circuiting. In Comparative Example 1, the measurement was thus not able to be continued. On the other hand, voltages up to 75 V and 85 V were able to be applied to the piezoelectric elements of Examples 1 and 2, respectively, and their stains were measured, as shown in FIG. 16. This demonstrates that the piezoelectric elements of Examples 1 and 2 exhibited an enhanced voltage resistance and, accordingly, higher reliability.

Figure 17:
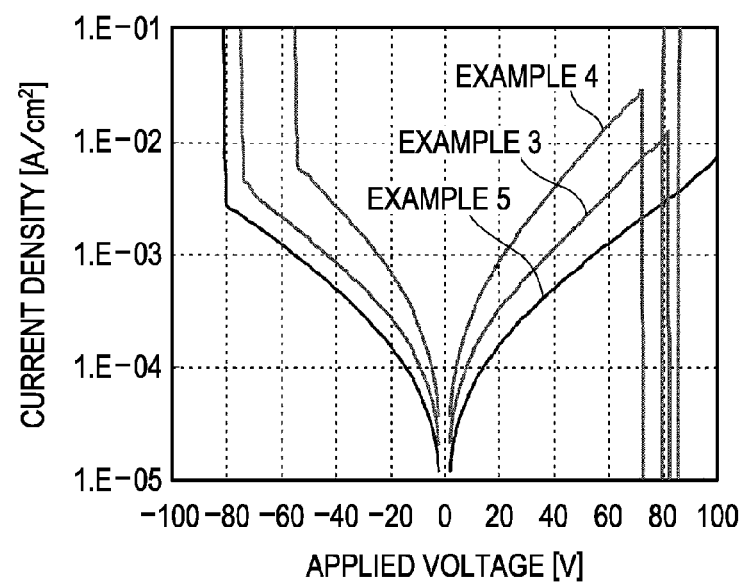
FIG. 17 illustrates a plot showing the resistance to an applied voltage of Examples 3 to 5.

FIG. 17 shows the results of experiments for withstanding voltage and leakage current performed on the piezoelectric elements of Examples 3 to 5. In the plot, the horizontal axis represents the voltage (V) applied, and the vertical axis represents the current density for the voltage.

As shown in FIG. 17, voltages of up to 60 V, which would be normally applied to liquid ejecting heads including piezoelectric elements, were able to be applied to all the piezoelectric elements of Examples 3 to 5.

In addition, in comparison with Example 3, in which the composition ratio $X_{Bi/Ba}$, was 75/25, and Example 4, in which the composition ratio $X_{Bi/Ba}$, was 80/20, Example 5, which had a composition ratio $X_{Bi/Ba}$, of 70/30 and thus had a higher barium-containing BT composition ratio than other Examples, exhibited higher resistance to voltage. Thus the leakage current was reduced in Example 5.

4.5. Substitutability of Additional Elements

Figure 18:
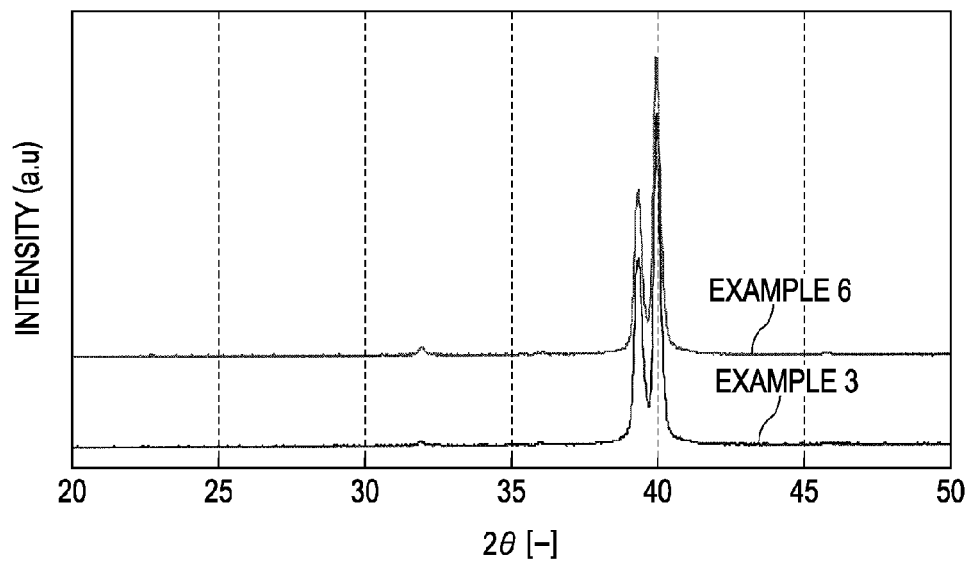
FIG. 18 illustrates a plot of the X-ray diffraction patterns of Examples 3 and 6.

FIG. 18 shows the results of X-ray diffraction pattern analysis of the piezoelectric elements of Examples 3 and 6.

As shown in FIG. 18, the X-ray diffraction pattern of the piezoelectric element of Example 3 using manganese (Mn) as an additional element was substantially the same as that of the piezoelectric element of Example 6 using cobalt (Co) as an additional element. This shows that any element, within the range in which the advantages of the invention can be ensured, can be additionally added to the piezoelectric ceramic without limiting the additional element to manganese or cobalt.

4.6. Technical Evaluation of (111) Orientation Control

Figure 19:
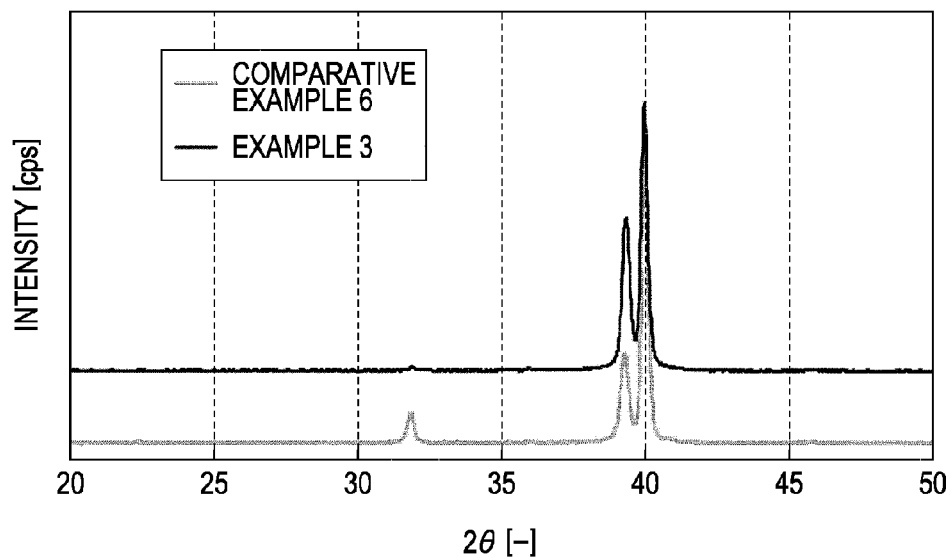
FIG. 19 illustrates a plot of the X-ray diffraction patterns of Example 3 and Comparative Example 6.
Figure 20:
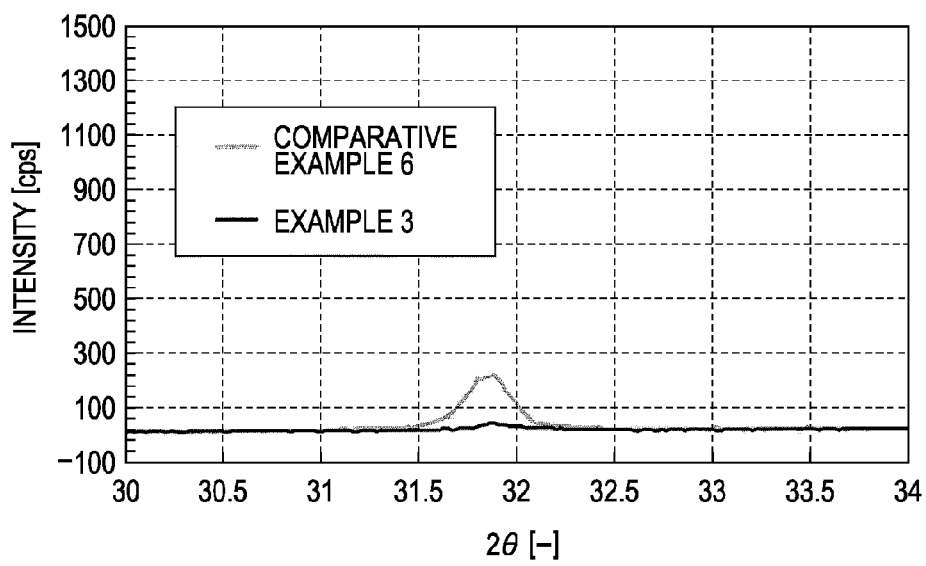
FIG. 20 illustrates a plot of the X-ray diffraction patterns of Example 3 and Comparative Example 6.

FIGS. 19 and 20 show the results of X-ray diffraction pattern analysis of the piezoelectric elements of Example 3 and Comparative Example 6.

As shown in FIGS. 19 and 20, the piezoelectric layer of Example 3, which had been formed by forming a first piezoelectric sub-layer and then forming other piezoelectric sub-layers in twos, was oriented only in the (111) plane without being oriented in the (100) plane or the (110) plane. On the other hand, the piezoelectric layer of Comparative Example 6, which had been formed by forming a first piezoelectric sub-layer and then forming other piezoelectric sub-layers in threes, was oriented not only in the (111) plane, but also in the (110) plane. Thus, it was shown that it is technically difficult to control the orientation of BFO-BT ceramics to the (111) plane.

5. Liquid Ejecting Head

Figure 21:
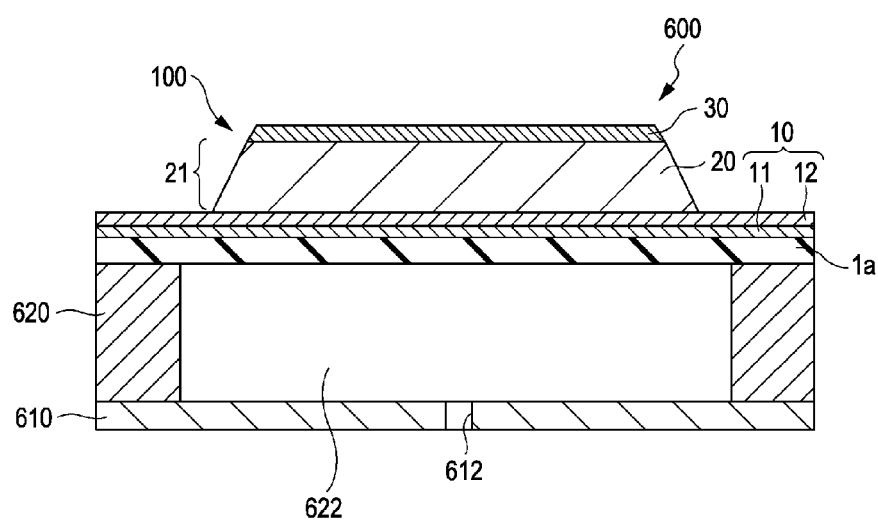
FIG. 21 illustrates a schematic sectional view of a liquid ejecting head according to an embodiment of the invention.
Figure 22:
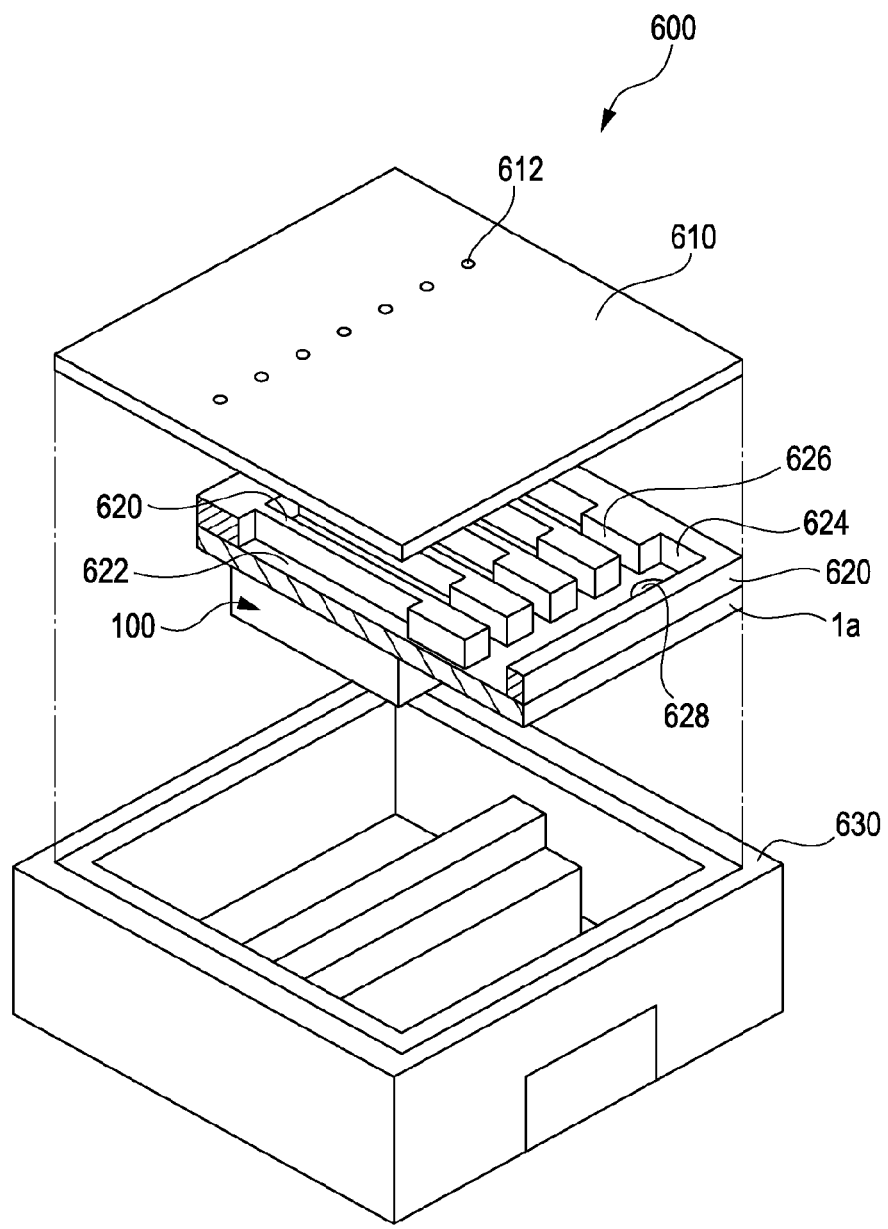
FIG. 22 illustrates an exploded perspective view of the liquid ejecting head.

A liquid ejecting head according to an embodiment of the invention will now be described with reference to drawings. FIG. 21 illustrates a schematic sectional view of a liquid ejecting head 600. FIG. 22 is an exploded perspective view of the liquid ejecting head 600 and shows a state where the head is reversed from the normal position.

The liquid ejecting head 600 includes a piezoelectric element according to an embodiment of the invention. In the following description, the above-described piezoelectric element 100 is used as the piezoelectric element.

The liquid ejecting head 600 may include a vibration plate 1a, a nozzle plate 610, a flow channel substrate 620, the piezoelectric element 100, and an enclosure 630, as shown in FIGS. 21 and 22. FIG. 22 shows the piezoelectric element 100 in a simplified from.

The nozzle plate 610 has nozzle apertures 612, as shown in FIGS. 21 and 22. Ink is ejected through the nozzle apertures 612. A plurality of nozzle apertures 612 may be formed in the nozzle plate 610. In the embodiment shown in FIG. 22, the nozzle apertures 612 are aligned in a line. The nozzle plate 610 may be made of silicon or stainless steel (SUS).

The flow channel substrate 620 is disposed on the nozzle plate 610 (under the nozzle plate in FIG. 22). The flow channel substrate 620 may be made of, for example, silicon. The flow channel substrate 620 divides the space between the nozzle plate 610 and the vibration plate 1a so as to form a reservoir (liquid storage portion) 624, delivering paths 626 communicating with the reservoir 624, and pressure generating chambers 622 communicating with the respective delivering paths 626, as shown in FIG. 22. In this embodiment, the reservoir 624, the delivering paths 626 and the pressure generating chambers 622 are described separately. However, they all function as liquid flow channels (may be referred to as manifold), and the flow channels can be arbitrarily designed without particular limitation. The delivering paths 626 shown in FIG. 22 are each partially narrowed, but can be formed in any shape according to the design without being limited to such a shape.

The reservoir 624 can temporally store ink supplied from the outside (for example, an ink cartridge) through a through hole 628 formed in the vibration plate 1a. The ink in the reservoir 624 is delivered to the pressure generating chambers 622 through the delivering paths 626. The capacity of the pressure generating chamber 622 is varied by the deformation of the vibration plate 1a. The pressure generating chambers 622 communicate with the corresponding nozzle apertures 612. By varying the capacity of the pressure generating chamber 622, the ink is ejected through the nozzle aperture 612.

The reservoir 624 and the delivering paths 626 may be formed in another member (not shown) other than the flow channel substrate 620, as long as they can communicate with the pressure generating chambers 622.

The piezoelectric element 100 is disposed over the flow channel substrate 620 (under the flow channel substrate in FIG. 22). The piezoelectric element 100 is electrically connected to a piezoelectric element driving circuit (not shown) so as to be operated (for vibration or deformation) according to the signal from the piezoelectric element driving circuit. The vibration plate 1a is deformed by the behavior of the piezoelectric layer 20 to vary the pressure in the pressure generating chamber 622 as required.

The enclosure 630 accommodates the nozzle plate 610, the flow channel substrate 620, the vibration plate 1a and the piezoelectric element 100, as shown in FIG. 22. The enclosure 630 can be made of, for example, a resin or a metal.

The liquid ejecting head 600 includes the piezoelectric element 100 that can exhibit a small environmental load, and an increased strain and enhanced reliability. Accordingly, the liquid ejecting head 600 can exhibit a small environmental load, high reliability, and high ejection ability.

The above embodiment illustrates a liquid ejecting head 600 in which a piezoelectric element 100 including a piezoelectric layer 20 disposed between two electrodes 10 and 30 generates deflection vibration to vary the capacity of the pressure generating chamber 622. However, in a liquid ejecting head according to another embodiment of the invention, a piezoelectric element having a multilayer structure of alternately formed piezoelectric layers and electrodes may be secured to a fixing substrate so that the capacities of the pressure generating chambers are varied by vertical vibration. Alternatively, a liquid ejecting head according to still another embodiment may include a shear mode type piezoelectric element in which the capacity of the pressure generating chamber is varied by shearing deformation, but not by extension and shrinkage.

The above embodiment illustrates a liquid ejecting head 600 acting as an ink jet recording head. However, the liquid ejecting head may be used as a color material ejecting head used for manufacturing color filters of liquid crystal displays or the like, an electrode material ejecting head used for forming electrodes of organic EL displays or field emission displays (FEDs), or a bioorganic material ejecting head used for manufacturing bio-chips.

6. Liquid Ejecting Apparatus

Figure 23:
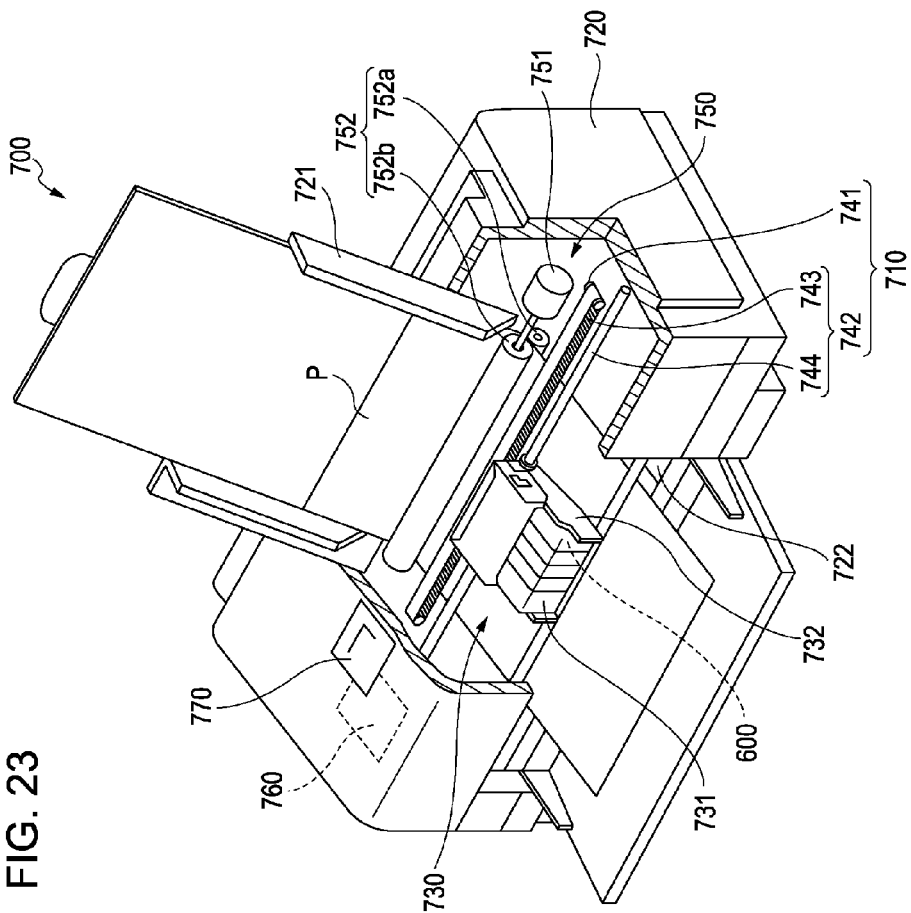
FIG. 23 illustrates a schematic perspective view of a liquid ejecting apparatus according to an embodiment of the invention.

A liquid ejecting apparatus according to an embodiment of the invention will now be described with reference to FIG. 23. FIG. 23 is a schematic perspective view of the liquid ejecting apparatus 700 according to an embodiment of the invention.

The liquid ejecting apparatus 700 includes a liquid ejecting head according to an embodiment of the invention. In the following description, the liquid ejecting apparatus 700 includes the above-described liquid ejecting head 600.

The liquid ejecting apparatus 700 includes a head unit 730, a driving section 710, and a control section 760, as shown in FIG. 23. The liquid ejecting apparatus 700 further includes an apparatus body 720, a paper feeding section 750, a tray 721 on which recording paper P is placed, a paper ejecting port 722 from which the recording paper P is ejected, and a control panel 770 disposed on the upper surface of the apparatus body 720.

The head unit 730 includes an ink jet recording head (hereinafter may be simply referred to as the head) that is the above-described liquid ejecting head 600. The head unit 730 further includes an ink cartridge 731 from which an ink is delivered to the head, and a transport portion (carriage) 732 on which the head and the ink cartridge 731 are disposed.

The driving section 710 reciprocally moves the head unit 730. The driving section 710 includes a carriage motor 741 acting as a driving source of the head unit 730, and a reciprocal movement mechanism 742 allowing the head unit 730 to be reciprocally moved by the rotation of the carriage motor 741.

The reciprocal movement mechanism 742 includes a carriage guide shaft 744 whose ends are held by a frame (not shown), and a timing belt 743 extending in parallel with the carriage guide shaft 744. The carriage guide shaft 744 supports the carriage 732 so as to allow the reciprocal movement of the carriage 732. The carriage 732 is secured to part of the timing belt 743. When the timing belt 743 is moved by the operation of the carriage motor 741, the head unit 730 reciprocally moves along the carriage guide shaft 744. The head ejects ink during the reciprocal movement to print on the recording paper P.

In the liquid ejecting apparatus of the present embodiment, printing is performed while both the liquid ejecting head 600 and the recording paper P are moving. However, only either the liquid ejecting head 600 or the recording paper P may move, as long as the liquid ejecting head 600 can perform recording on paper P while the positions of the head 600 and the recording paper P are relatively changed. In the present embodiment, printing is performed on the recording paper P. However, the recording medium on which the liquid ejecting apparatus prints is not limited to paper, and it can be appropriately selected from a wide range of media including cloth, plastic sheets, and metal sheets.

The control section 760 can control the head unit 730, the driving section 710 and the paper feeding section 750.

The paper feeding section 750 feeds recording paper P toward the head unit 730 from the tray 721. The paper feeding section 750 includes a paper feeding motor 751 acting as a driving source, and paper feeding rollers 752 rotated by the operation of the paper feeding motor 751. The paper feeding rollers 752 include a driven roller 752a and a driving roller 752b vertically opposing each other between which the recording paper P is fed. The driving roller 752b is coupled with the paper feeding motor 751. When the paper feeding section 750 is driven by the control section 760, the recording paper P is transported under the head unit 730. The head unit 730, the driving section 710, the control section 760 and the paper feeding section 750 are disposed within the apparatus body 720.

The liquid ejecting apparatus 700 includes the liquid ejecting head 600 that can exhibit a small environmental load, high reliability, and high liquid ejection ability. Accordingly, the liquid ejecting apparatus 700 can exhibit a small environmental load, high reliability, and high ejection ability.

While the invention has been described with reference to exemplary embodiments, it is to be understood that various modifications may be made without departing from the new features and effects of the invention. Such modifications are within the scope of the invention.

What is claimed is:

1. A piezoelectric element comprising:
a piezoelectric layer made of a complex oxide having a perovskite structure, the piezoelectric layer containing bismuth, barium, iron and titanium and having an intensity ratio of a (111) orientation intensity to a (100) orientation intensity of 3 or more, wherein the piezoelectric layer is preferentially orientated in the (111) plane at a rate of 90% or more, and
electrodes that apply a voltage to the piezoelectric layer.

2. The piezoelectric element according to claim 1, wherein a composition ratio of the bismuth to the barium in the complex oxide is in a range of 70/30 to 80/20.

3. The piezoelectric element according to claim 1, wherein the piezoelectric layer is oriented only in the (111) plane.

4. The piezoelectric element according to claim 1, wherein the electrodes include a first electrode disposed on a pressure generating chamber side of the piezoelectric layer, and a second electrode opposing the first electrode with the piezoelectric layer therebetween, the first electrode including a plurality of conductive layers, wherein a conductive layer closest to the piezoelectric layer is made of a conductive strontium compound.

5. The piezoelectric element according to claim 4, wherein the conductive strontium compound is strontium ruthenate.

6. The piezoelectric element according to claim 4, wherein the conductive strontium compound is strontium titanate containing niobium.

7. The piezoelectric element according to claim 4, wherein the conductive strontium compound is preferentially oriented in the (111) plane.

8. The piezoelectric element according to claim 1, further comprising a silicon substrate between a pressure generating chamber and the piezoelectric element.

9. The piezoelectric element according to claim 1, wherein the complex oxide contains at least one additional element selected from a group consisting of manganese, cobalt, nickel, aluminum, zinc, and titanium.

10. The piezoelectric element according to claim 1, wherein the complex oxide is in a pseudo-cubic system.

11. A liquid ejecting head comprising the piezoelectric element as set forth in claim 1.

12. A liquid ejecting apparatus comprising the liquid ejecting head as set forth in claim 11.

* * * * *